US008502141B2

(12) United States Patent
Hasegawa et al.

(10) Patent No.: US 8,502,141 B2
(45) Date of Patent: Aug. 6, 2013

(54) GRAPHICAL USER INTERFACE FOR USE WITH ELECTRON BEAM WAFER INSPECTION

(75) Inventors: Masaki Hasegawa, Sayama (JP); Hisaya Murakoshi, Tokyo (JP); Hiroshi Makino, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 168 days.

(21) Appl. No.: 12/457,734

(22) Filed: Jun. 19, 2009

(65) Prior Publication Data

US 2009/0261252 A1 Oct. 22, 2009

Related U.S. Application Data

(63) Continuation of application No. 11/698,025, filed on Jan. 26, 2007, now Pat. No. 7,566,871.

(30) Foreign Application Priority Data

Feb. 6, 2006 (JP) .................................. 2006-027861

(51) Int. Cl.
*G01N 23/00* (2006.01)
*G21K 7/00* (2006.01)
(52) U.S. Cl.
USPC ............ 250/306; 250/307; 250/310; 715/810
(58) Field of Classification Search
USPC .................. 250/306–311; 715/810, 856, 859
See application file for complete search history.

(56) References Cited

U.S. PATENT DOCUMENTS

| 5,502,306 | A | | 3/1996 | Meisburger et al. |
| 5,576,833 | A | | 11/1996 | Miyoshi et al. |
| 5,894,311 | A | * | 4/1999 | Jackson ........................ 345/440 |

(Continued)

FOREIGN PATENT DOCUMENTS

| JP | 5-258703 | 5/1992 |
| JP | 7-249393 | 3/1994 |
| JP | 11-108864 | 10/1997 |

OTHER PUBLICATIONS

Stokowski, Stan and Mehdi Vaez-Iravani, "Wafter Inspection Technology Challenges for ULSI Manufacturing", AIP Conf. Proc. 449, 405 (1998), DOI: 10.1063/.

*Primary Examiner* — Phillip A Johnston
*Assistant Examiner* — Brooke Purinton
(74) *Attorney, Agent, or Firm* — Stites & Harbison PLLC; Juan Carlos A. Marques, Esq.; Nicholas B. Trenkle, Esq.

(57) ABSTRACT

Because a mirror electron imaging type inspection apparatus for obtaining an inspection object image with mirror electrons has been difficult to optimize inspection conditions, since the image forming principles of the apparatus are different from those of conventional SEM type inspection apparatuses. In order to solve the above conventional problem, the present invention has made it possible for the user to examine such conditions as inspection speed, inspection sensitivity, etc. intuitively by displaying the relationship among the values of inspection speed S, inspection object digital signal image pixel size D, inspection object image size L, and image signal acquisition cycle P with use of a time delay integration method as a graph on an operation screen. The user can thus determine a set of values of a pixel size, an inspection image width, and a TDI sensor operation cycle easily with reference to the displayed graph.

16 Claims, 10 Drawing Sheets

U.S. PATENT DOCUMENTS

| | | |
|---|---|---|
| 6,797,954 B2 | 9/2004 | Shinada et al. |
| 6,933,499 B2 * | 8/2005 | Furukawa et al. ............ 250/307 |
| 6,988,017 B2 * | 1/2006 | Pasadyn et al. ............... 700/121 |
| 7,176,459 B2 * | 2/2007 | Watanabe et al. ............. 250/310 |
| 2002/0088940 A1 * | 7/2002 | Watanabe et al. ............. 250/310 |
| 2002/0131802 A1 * | 9/2002 | Shimizu et al. ............... 399/405 |
| 2003/0006373 A1 | 1/2003 | Koguchi |
| 2004/0227079 A1 | 11/2004 | Nara et al. |
| 2005/0051722 A1 | 3/2005 | Makino et al. |
| 2006/0076490 A1 | 4/2006 | Gunji et al. |

* cited by examiner

UNEVEN SPECIMEN

NEGATIVE CHARGED VIA

POSITIVELY CHARGED VIA

CIRCUIT PATTERN SCHEMATIC DIAGRAM

TOP VIEW

CROSS SECTIONAL VIEW (AA')

MIRROR ELECTRON IMAGE

GRAPHICAL USER INTERFACE FOR USE WITH ELECTRON BEAM WAFER INSPECTION

CROSS REFERENCE TO RELATED APPLICATIONS

This application is a Continuation application of U.S. application Ser. No. 11/698,025 filed Jan. 26, 2007 now U.S. Pat. No. 7,566,871. Priority is claimed based on U.S. application Ser. No. 11/698,025 filed Jan. 26, 2007, which claims the priority of Japanese Patent Application No. 2006-027861 filed on Feb. 6, 2006, the content of which is hereby incorporated by reference into this application.

FIELD OF THE INVENTION

The present invention relates to a method and an apparatus for inspecting an electrical defect of a microstructure circuit formed on a semiconductor wafer.

BACKGROUND OF THE INVENTION

As a method for detecting a defect of a circuit pattern formed on a wafer by comparing images in a manufacturing process of a semiconductor device, for example, a pattern comparing inspection method is disclosed in JP-A No. 258703/1993. The method uses an SEM in which, a point focused electron beam is scanned. The SEM type inspection apparatus is higher in resolution than optical inspection systems and it has a feature for enabling such an electrical defect as a connecting failure to be detected. However, because the SEM type inspection apparatus scans an electron beam on a specimen surface two-dimensionally to obtain an image, the scanning time is long. This disadvantage will become a substantial obstacle for reducing the inspection time.

As an electron beam inspection method that has successfully reduced the inspection time, for example, the JP-A No. 249393/1995 discloses a projection type inspection apparatus, which illuminates a rectangular electron beam onto semiconductor wafer and forms an image of buck scattering and secondary electrons with use of electron lenses. The projection type inspection apparatus can illuminate an electron beam with a larger current than that of the SEM type at a time, thereby obtaining a plurality of images collectively. The projection type is thus expected to form images more quickly than those of the SEM type, that is, the scanning electron type.

On the other hand, a secondary electron mapping type inspection apparatus cannot obtain a sufficient resolution due to the aberration of the objective lens, thereby it is difficult to obtain a required defect detection sensitivity. The JP-A No. 108864/1999 points out such disadvantages of the apparatus. The JP-A No. 108864/1999 discloses a mirror electron imaging type wafer inspection apparatus that uses electrons pulled back (hereunder, to be referred to as mirror electrons or mirror reflecting electrons) before colliding with a specimen due to a negative electric field formed just above the wafer as imaging electrons.

Here, the mirror electron imaging type wafer inspection apparatus will be described. The mirror electron imaging type wafer inspection apparatus obtains an image to be used for inspection with use of a mirror electron microscope. An inspection image is obtained by illuminating an electron beam onto a specimen and forms an image of the reflecting electron beam. At this time, a negative potential is applied onto the surface of the specimen in advance so that the illuminated electron beam is reflected on a specific equipotential surface in the vicinity of the specimen surface without reaching the specimen surface. The electrons reflected on an equipotential surface in the vicinity of the specimen surface such way are referred to as "mirror electrons". Because the equipotential surface of the specimen surface is influenced by the information of an unevenness and a potential change of the specimen surface itself, the image to be obtained is also influenced by the information of the unevenness and the potential change of the specimen surface when the mirror electrons are imaged. Consequently, shape and electrical defects of the specimen surface can be detected by comparing such a mirror electron image with a reference image, respectively.

SUMMARY OF THE INVENTION

As described above, the mirror electron imaging type wafer inspection apparatus differs completely from any of the conventional SEM type inspection apparatuses. Consequently, to put the mirror electron imaging type wafer inspection apparatus for practical use, it is needed to think out a method for setting inspection conditions optimized for the apparatus. Under such circumstances, it is an object of the present invention to realize an inspection condition setting method optimized for the object mirror electron imaging type wafer inspection apparatus and make it easier to operate the apparatus.

Upon thinking out a method for setting such inspection conditions optimized for the mirror electron imaging type wafer inspection apparatus, the present inventor has examined the following circumstances.

A mirror electron imaging type wafer inspection apparatus employed in a semiconductor device manufacturing line is often used for defect inspection in all or some specific portions of every wafer flowing on the manufacturing line. Thus where an inspection process is to be inserted between semiconductor processes and how long time is to be spared for the inspection process should be determined carefully by giving consideration to the productivity of the semiconductor manufacturing line. In other words, if the inspection process is designed in detail to improve the yield, the productivity is lowered in proportion to an increase of the inspection time. Furthermore, when the inspection time is reduced, both the inspection accuracy and the productivity are lowered. Such way, in each of various manufacturing lines for improving the productivity, in which the defect generating rate, defect generating process, and productivity are different from each another, there is an optimized inspection time that should be employed for the object line specifically. Thus the inspection time comes to be varied among those manufacturing lines. This is why the inspection speed should be set flexibly for the mirror electron imaging type wafer inspection apparatus so as to make inspections most efficiently by giving consideration to the circumstances specific to each of such various semiconductor device manufacturing lines.

The inspection speed of the mirror electron imaging type wafer inspection apparatus means an area of a wafer that can be inspected per unit time. FIG. 2 shows the arrangement of pixels for composing an inspection object image. In FIG. 2, each cell means a pixel 201. The call is usually a square of which the length of this side is represented by D. An inspection image of the mirror electron imaging type wafer inspection apparatus is obtained with use of a time delay integration data acquisition method (TDI method). In the TDI method, integration is made by sending image signals in the vertical direction of the image synchronously with the movement of the wafer (as shown with a white arrow in FIG. 2). The cycle in which one signals of pixel are sent in the vertical direction is defined as P. And the length in a direction (horizontal direction in FIG. 2) normal to the movement of the wafer in the image region is defined as L. The image data of length L×width D area (gray region shown in FIG. 2) is sent in a cycle P to an image processing apparatus. Consequently, the inspection speed S can be described by using D, P, and L in the following expression:

$$S = D \times L \times P.$$

To operate the apparatus at an optimized speed, therefore, the user is requested to satisfy the relationship among D, L, and P shown above and adjust the D, L, and P values so as not to degrade the inspection sensitivity. Particularly, in the case of the mirror electron imaging type wafer inspection apparatus, the pixel size optimized for inspection is changed depending on the magnification of the imaging optical system for mirror reflecting electrons. This change depends on the characteristics such as the material, structure, etc. of the specimen. And such characteristics are never generated in any of SEM and secondary electron projection type electron optical systems; the characteristics are specific to the mirror optical systems. The user of the apparatus, therefore, is requested to adjust the D, L, and P values by giving consideration to the magnification of the optical system.

Conventionally, the apparatus manager and the apparatus developer have set such D, P, and L values with the method of trial and error by giving consideration to the characteristics of the mirror electron imaging type wafer inspection apparatus and the inspection object, which has leads very troublesome condition setting. Furthermore, usually the user's interest is just the inspection speed. The user would thus feel very troublesome when requested to set such conditions and will come to have a feeling of confusion when operating the apparatus.

In order to solve the above described conventional problems, therefore, the present invention has enabled such S, D, L, and P values to be displayed on an operation screen so that the user can examine such conditions as inspection speed, inspection sensitivity, etc. intuitively. Furthermore, the present invention has provided a process newly for converting user determined conditions to conditions for operating an electron optical system, a time delay integration type imaging device, and a wafer moving stage respectively so that the user can make inspections in accordance with the circumstances of various semiconductor manufacturing lines without understanding the details of the inspection apparatus.

According to the present invention, therefore, it is possible to set such conditions as optimized pixel size, illuminating area size, etc. to easily realize an inspection speed capable of preventing an semiconductor device manufacturing line from delay so that the user can inspect defects of each semiconductor pattern efficiently under optimized conditions. Because such inspection conditions can be set easily such way, the total inspection time from condition setting to end of inspection can be reduced. And because the apparatus can be operated easily, the apparatus will also have advantages in sales policy.

DETAILED DESCRIPTION OF PREFERRED EMBODIMENTS

Hereunder, a description will be made in detail for a configuration of a mirror electron imaging type wafer inspection apparatus in a preferred embodiment of the present invention with reference to the accompanying drawings.

First Embodiment

Figure 1:
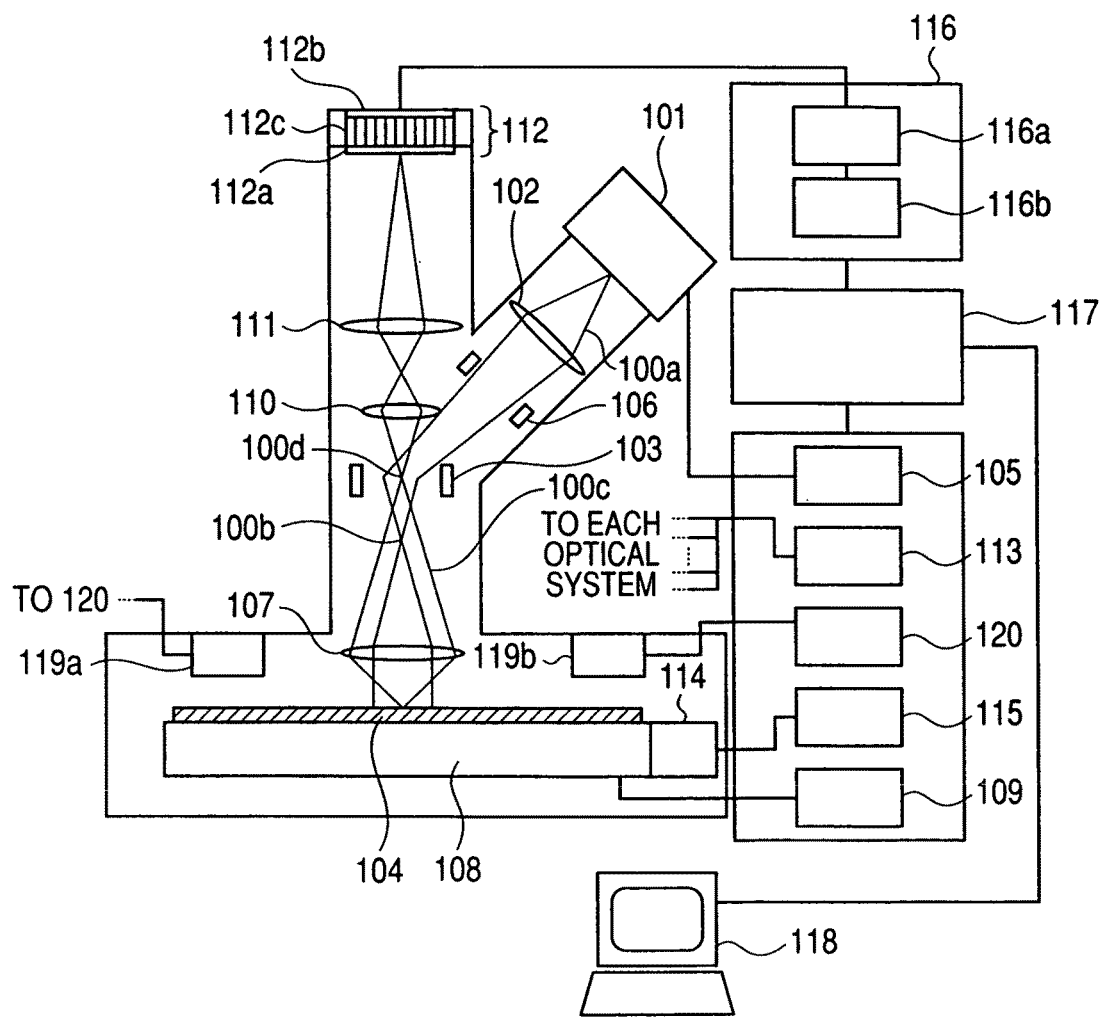
FIG. 1 is a diagram for describing a basic configuration of a mirror electron imaging type wafer inspection apparatus.
Figure 2:
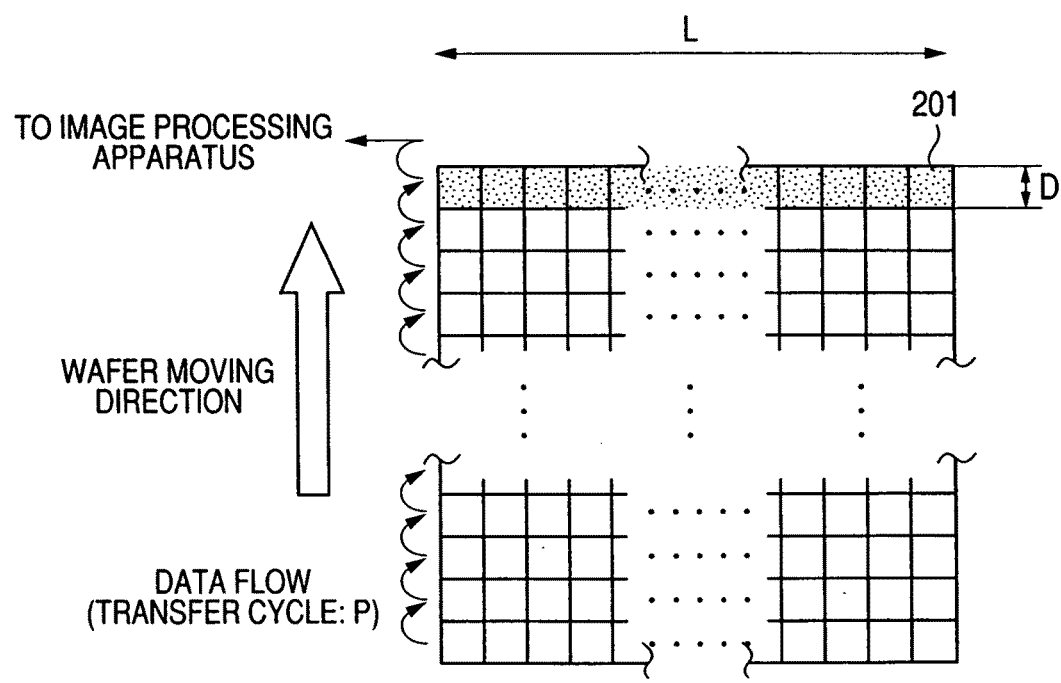
FIG. 2 is a diagram for describing how to obtain an inspection image with a TDI image acquisition method.

FIG. 1 shows an example of a hardware configuration of the mirror electron imaging type wafer inspection apparatus in the preferred embodiment of the present invention. In FIG. 1, vacuum pumps, their controller, pipes for evacuating systems, etc. are omitted.

At first, main elements of the electron optical system of the apparatus will be described. An illuminating electron beam 100a emitted from an electron gun 101 is focused by a condenser lens 102 and deflected by an ExB deflector 103 to form a cross-over 100b, then illuminated onto a specimen wafer 104 as an approximate parallel flux. In FIG. 1, although only one condenser lens 102 is used, a plurality of lenses may be combined into a lens system to optimize the optical conditions. The electron gun 101 is usually a Zr/O/W type Schottky electron source. Such voltages and currents as an extracting voltage applied to the electron gun 101, an accelerating voltage to extracted electrons, a heating current of an electron source filament, etc. required for operating the apparatus are supplied and controlled by an electron gun controller 105.

The ExB deflector 103 is disposed in the vicinity of an imaging plane 100d of an imaging electron beam 100c. At this time, an aberration occurs in the illuminating electron beam 100a due to the ExB deflector 103. If this aberration must be corrected, another ExB deflector 106 for correcting the aberration is disposed between an illuminating system condenser lens 102 and the ExB deflector 103. The illuminating electron beam 100a deflected by the ExB deflector 103 so as to go along an axis perpendicular to the wafer 104 is formed by an objective lens 107 as a planar electron beam entered in a direction perpendicular to the surface of the specimen wafer 104. On the focal plane of the objective lens 107 is formed a finer cross-over by the illuminating system condenser lens 102. Thus the electron beam can be illuminated onto the specimen wafer 104 just in parallel. A region of the specimen wafer 104, in which the illuminating electron beam 100a is illuminated, is an area as large as, for example, 2500 µm², 10000 µm², or the like.

The specimen wafer 104 mounted on a wafer stage 108 receives a negative voltage almost equal to or slightly higher larger absolute value than the accelerating voltage of the electron beam. This negative potential works on the illuminating electron beam 100a so that it slows down just before reaching the wafer 104 and pulled back upward to become as reflecting mirror electrons, thereby it does not collide the wafer 104 in most cases. The voltage applied to the wafer 104 is supplied and controlled by a wafer voltage controller 109. In order to make the illuminating electrons reflected in the vicinity of the wafer 104, a difference from the accelerating voltage of the illuminating electron beam 100a is required to be adjusted accurately and the wafer voltage controller 109 and the electron gun controller 105 are controlled so that they are interlocked with each other.

Mirror electrons flying from the wafer side includes information related to an electrical defect of an object circuit pattern formed on the wafer 104. Thus its image is formed with use of an electron imaging optical system to be fetched in the apparatus as an image for determining whether there is a defect in the pattern or not. The mirror electrons are focused by the objective lens 107. And the ExB deflector 103 is controlled so as not to deflect an electron beam advancing from below, so that the mirror electrons go up perpendicularly as are, then magnified and projected by an intermediate lens 110 and a projection lens 111 at an image detection part 112. In FIG. 1, only one projection lens 111 is used, but a plurality of lenses may be composed into a projection system to provide a higher magnification and correct distortions of images. The image detection part 112 converts an image to an electrical signal and sends a distribution of the local charging potential of the surface of the wafer 104, that is, a defect image to an image processing part 112. The electron optical system is controlled by an electron optical system controller 113.

Next, the image detection part 112 will be described. A fluorescent plate 112a, an optical image detector 112b, and an optical image transmission system 112c are used for optical coupling to convert a mirror electron image to an optical image and detect the image. In this embodiment, an optical fiber bundle is used as the optical image transmission system 112c. The optical fiber bundle consists of the same number of thin optical fibers as the number of pixels and it can transmit optical images efficiently. In case where a fluorescent image is used with a sufficient light, the optical transmittance may be set lower. In such cases, instead of the optical fiber bundle, an optical lens is used and an optical image on the fluorescent plate 112a is formed by the optical lens on a light detecting surface of the optical image detector 112b. Furthermore, an amplifier is inserted in the optical image transmission system to transmit an optical image with a sufficient light. The optical image detector 112b converts an optical image formed on the light receiving plane to an electrical image signal and outputs the signal. As the optical image detector 112b, an TDI sensor is used. The TDI sensor uses a time delay integration (TDI) type CCD.

The image processing part 116 is composed of an image memory 116a and a defect determination part 116b. The image memory 116a inputs electron optical condition, image data, and stage position data from the electron optical system controller 113, the image detection part 112, and the stage controller 115 respectively and stores the image data by relating it to the coordinate system used on the specimen wafer. The defect determination part 116b uses image data related to the coordinates on the wafer and compares it with a preset value or with an adjacent pattern image or an image of the same pattern position in an adjacent die, or the like with use of various defect determination methods so as to determine a defect. The defect coordinates and an intensity of its corresponding pixel signal are transferred to and stored in the inspection apparatus controller 117. The user sets any one of those defect determination methods or the inspection apparatus controller 117 selects a method corresponding to the object wafer type in advance.

The inspection apparatus controller 117 inputs/outputs conditions for operating each part of the apparatus. The inspection apparatus controller 117 inputs beforehand various preset conditions such as electron beam accelerating voltage, current conditions for electron optical devices, wafer stage moving speed, timing for acquisition an image signal from an image detection element. The inspection apparatus controller 117 controls the controller of each element as an interface with the user. The inspection apparatus controller 117 may be composed of a plurality of computing devices connected to each another through a communication line and having a specific function. The apparatus further includes user interface device 118 with a monitor.

In the mirror electron imaging type wafer inspection apparatus, the electron beam hardly collides with the object wafer. Thus the specimen wafer may not be charged sufficiently in some cases. To detect an electrical defect, however, the wafer must be charged sufficiently to cause a difference from that of normal parts. The present invention has solved this problem by mounting pre-charging devices 119a and 119b. Those devices are controlled by a pre-charging controller 120. A charging potential formed on the wafer by the pre-charging devices 119a and 119b is used not to disturb the status of the electron beam that is reflected in the vicinity of the wafer surface. Thus the pre-charging controller 120 is interlocked and controlled together with the wafer voltage controller 109 and the electron gun controller 105.

Figure 3:
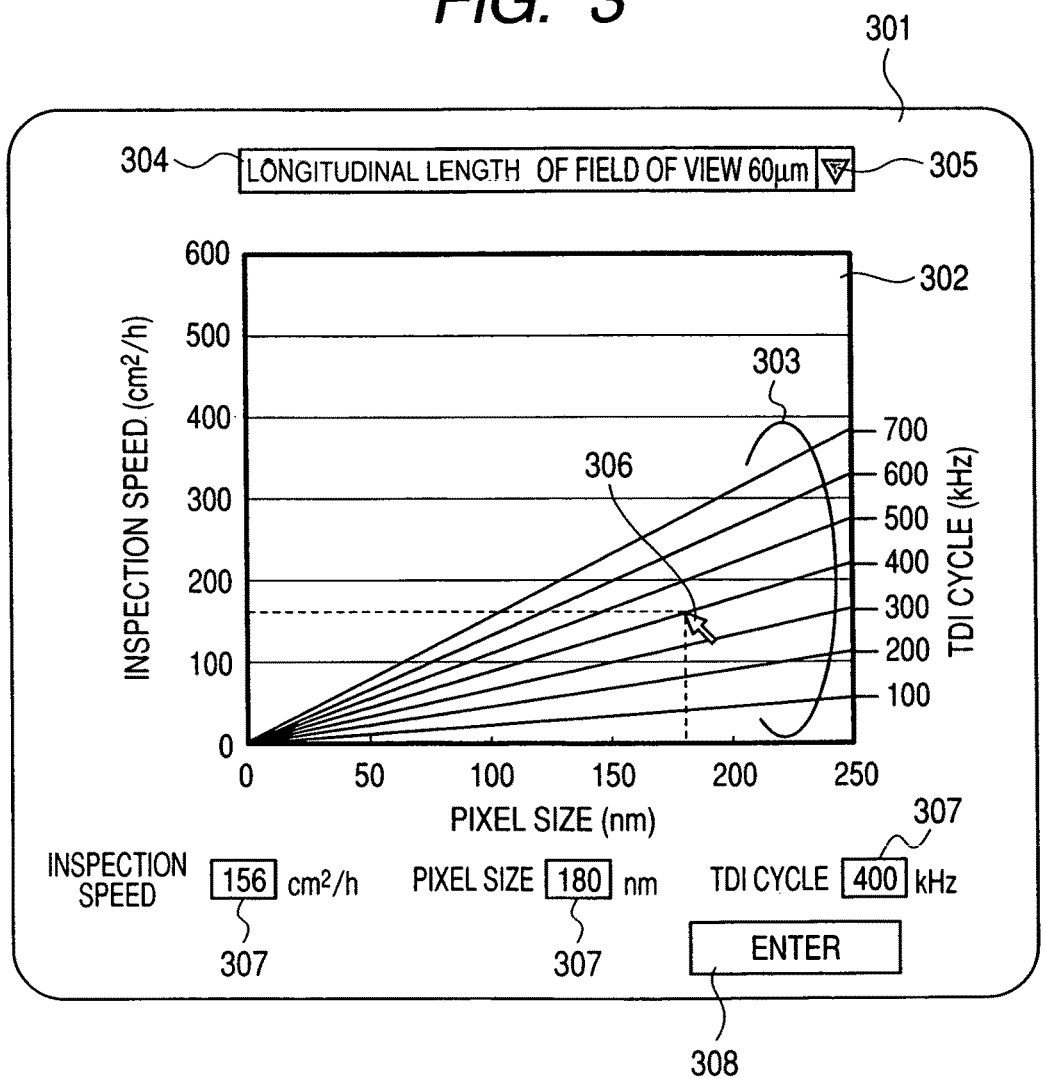
FIG. 3 is a diagram for describing an example of an inspection condition setting screen.

FIG. 3 is a first embodiment of a screen on which the user operates the inspection apparatus. This screen 301 is an "inspection condition setting screen" on which the user select an inspection speed and an inspection sensitivity or part of the screen. The screen 301 belongs to the user interface device with a monitor 118. A graph 302 displayed on the screen 301 has a horizontal axis that indicates a pixel size D and a vertical axis that indicates an inspection speed S. In the graph 302, the inspection speed S means an area on a wafer surface to be inspected per unit time and it is represented by an inspection area (cm$^2$/h) per hour. The user may select this unit to make it easier to understand. For example, the unit may be the number of wafers to be processed per hour or an inverse number to define a processing time of one wafer and a time required for a unit area inspection (e.g., h/cm$^2$).

Figure 4:
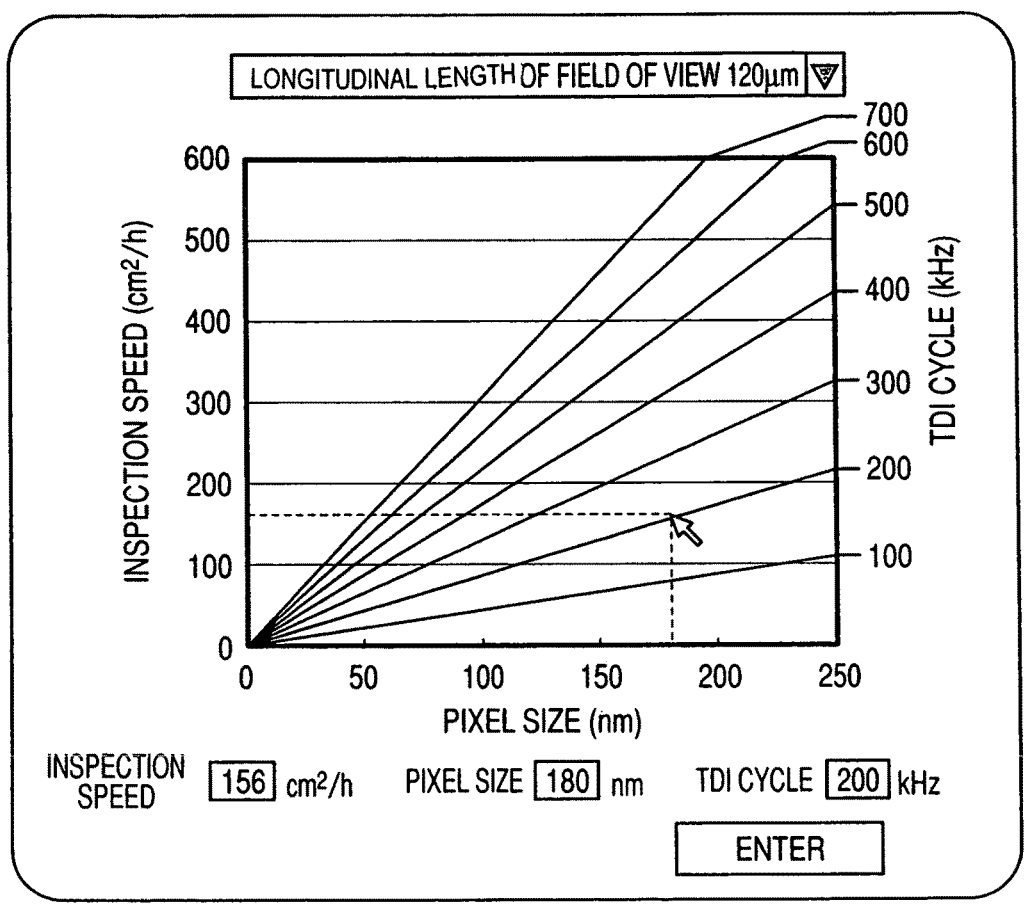
FIG. 4 is a diagram for describing another example of an inspection condition setting screen.

In the graph 302, a range from 0 cm$^2$/h to 600 cm$^2$/h is shown. The pixel size D is represented by a value corresponding to an actual size on the object wafer. It is within a range from 0 nm to 250 nm. The graph 302 also has a plurality of characteristic straight lines 303. These straight lines are used for different cycle P values of the TDI sensor respectively. The graph 302 uses values of 100 to 700 kHz selected as P values. The width L of an inspection image is displayed on an inspection image width display part 304. In this example, it is set as 60 μm. A plurality of conditions are displayed as a pull-down menu for this value when the user clicks the selection arrow 305. The user can select and change any of the conditions. If the user selects another value, a newly calculated straight line is displayed as shown in FIG. 4. FIG. 4 shows an example in which 120 μm is selected as an L value. The L value has its upper limit, which depends on the aberration of the objective lens. If the value goes over 200 μm, the distortion and the resolution degradation in marginal area of the field of view advance significantly. Consequently, the upper limit of the field of view usable as an inspection image is about 200 μm×200 μm.

The user can search an inspection speed and a pixel size by moving a white arrow pointer with a mouse on the graph 302. The values of the inspection speed, pixel size, TDI cycle calculated from the position of the pointer on the graph 302 are displayed in a display field 307 at the bottom of the screen. The user can select conditions with reference to such concrete values. In the graph 302, not only the values on straight lines, but also values between straight lines are calculated from the pointer position and displayed.

When conditions are determined on the graph 302, the user clicks the mouse button (not shown) or press a specific key on the keyboard (not shown) to fix the conditions. Those conditions are sent to the controller of the inspection apparatus when the user clicks the [ENTER] button 308 on the screen, then those conditions are converted to detailed operation conditions of the apparatus. Each of those conditions has its upper limit, which depends on the specifications of the apparatus. For example, if P=700 kHz is the upper limit in the specifications of the TDI camera and a condition is set in a region over 700 kHz, the condition is ignored.

The user can determine values of a set of the pixel size, inspection image width, and TDI sensor operation cycle with reference to the drawing.

Using the condition setting method in this embodiment makes it possible for the user to set an inspection speed of the mirror electron imaging type wafer inspection apparatus without trial and error.

Second Embodiment

In the first embodiment, the user determines conditions for operating the inspection apparatus with reference to mainly the values of inspection speed and pixel size and the relationship between the defect detection sensitivity and the pixel size is not clear. In this second embodiment, therefore, the horizontal axis of the graph displayed on the inspection speed S setting screen is used for defect detection sensitivity, thereby the user comes to know the relationship between the defect detection sensitivity and the pixel size intuitively. Instead of the horizontal axis, the vertical axis may also be used for the defect detection sensitivity.

Figure 5:
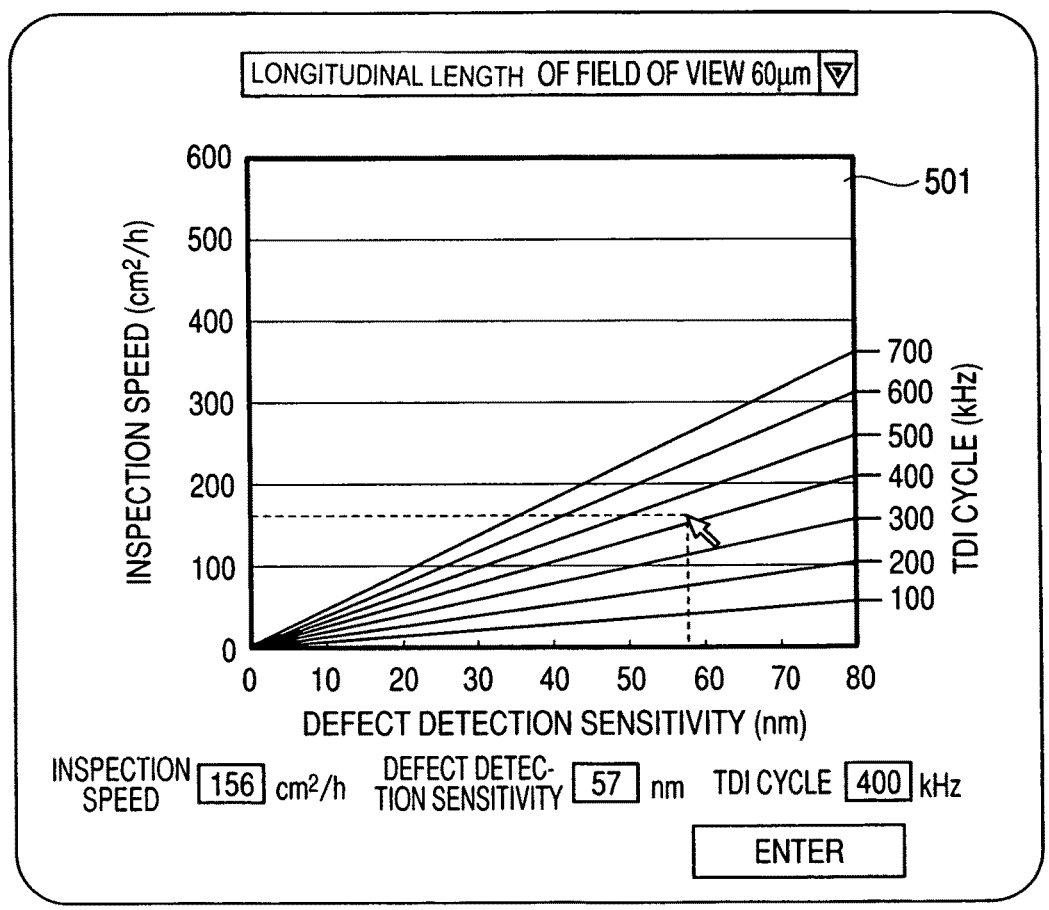
FIG. 5 is a diagram for describing still another example of an inspection condition setting screen.

FIG. 5 shows a schematic diagram of the inspection speed S setting screen displayed on the user interface device with a monitor 118 of the mirror electron imaging type wafer inspection apparatus. The user operation screen shown in FIG. 5 is displayed on the monitor of the mirror electron imaging type wafer inspection apparatus or mirror electron imaging type specimen inspection apparatus. Unlike that shown in FIG. 3, the horizontal axis of the graph 501 is used for the defect detection sensitivity. Explanations of the same items such as the pointer, the characteristic curve, etc. as those shown in FIG. 3 will be omitted to simplify the description.

Figure 6A:
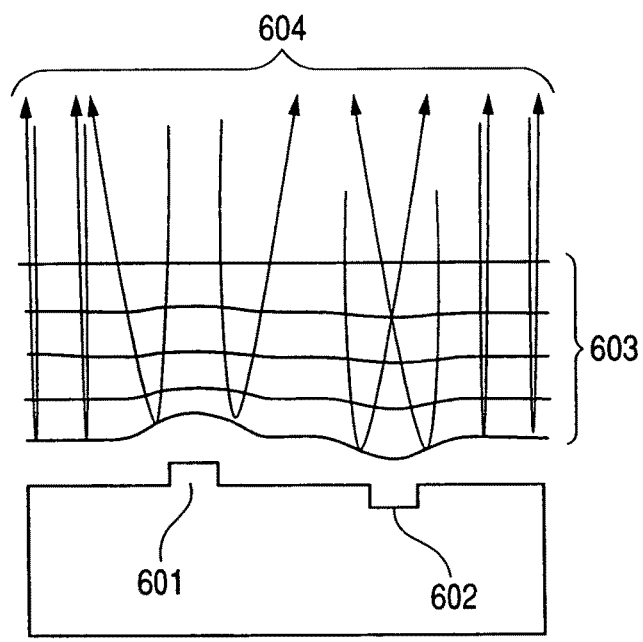
FIG. 6 is a diagram for describing principles of defect detection with a mirror electron image.
Figure 6B:
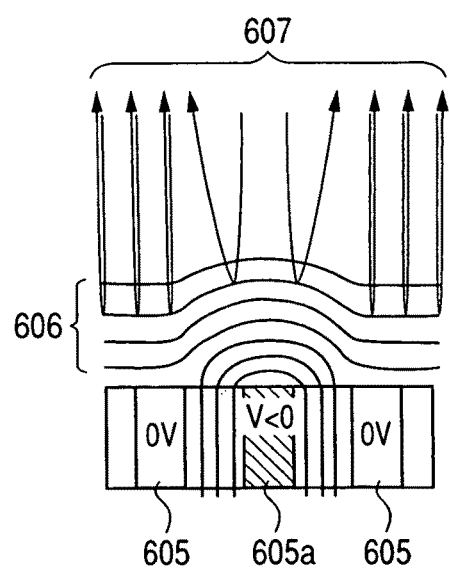
Figure 6C:
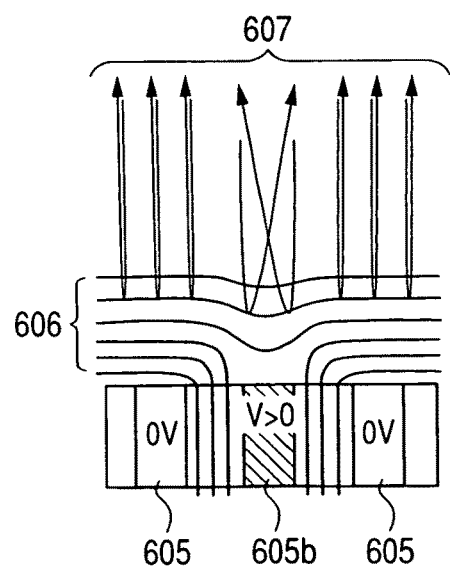

The relationship between the pixel size and the defect detection sensitivity is based on the magnification function of defect images specific to the mirror electron imaging type wafer inspection apparatus. An inspection object image of the mirror electron imaging type wafer inspection apparatus is obtained by imaging a distortion of an equipotential surface caused by existence of a defect. FIG. 6 is a diagram for describing principles of such mirror electron imaging. FIG. 6A shows a view of an equipotential surface 603 and a view of a trajectory 604 of illuminating electrons reflected from the equipotential surface 603 when such a protruded defect 601 as a particle and such a recessed defect 602 as a scratch are detected on the object wafer surface. FIGS. 6B and 6C are diagrams for showing a distortion of the equipotential surface 606 and a trajectory 607 of illuminating electrons when connecting failure defects 605a and 605b exist in vias 605 used for connecting to the lower layer wiring embedded in an oxide film respectively. In FIG. 6B, the electrically open via 605a is negatively charged. In FIG. 6C, the open via 605b is positively charged. In any of the unevenness caused by the shape and the electrical difference of the wafer surface, the distortion of the equipotential surface appear more widely than the actual size of the defect. In addition, when the equipotential surface is positioned higher, the distortion spreads widely while the distortion level is low. Consequently, a larger image is obtained when compared with the actual defect size by adjusting the mirror electron imaging optical system. This means that defects can be detected even when defect images are obtained with pixels larger than the actual defect size.

Figure 7A:
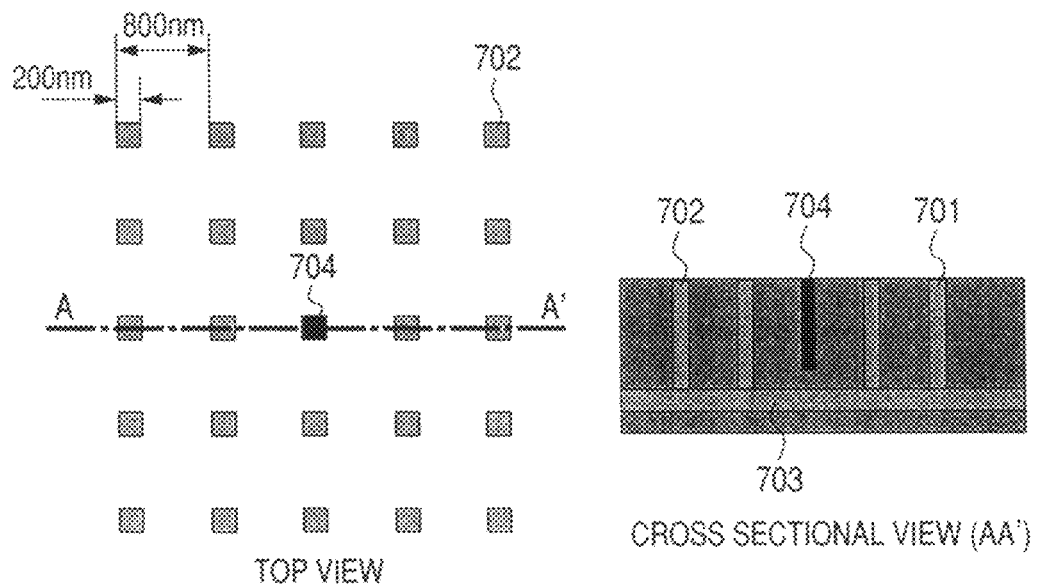
FIG. 7 is a diagram for describing an example of a defect expansion effect in an inspection object image with a mirror electron imaging method.
Figure 7B:
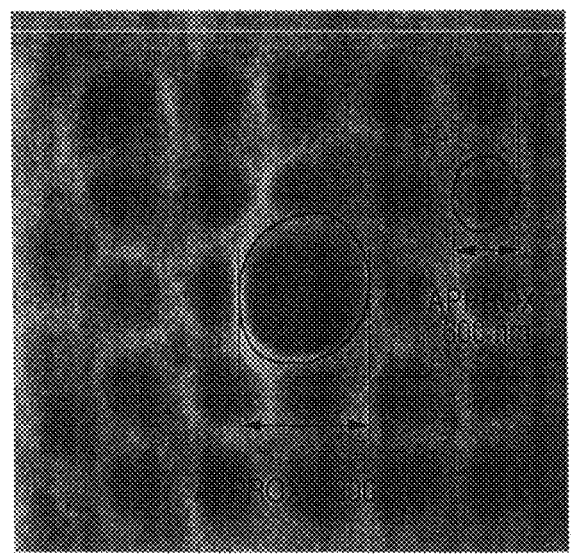

FIG. 7 is an example of an inspection image obtained with use of a mirror electron imaging method. FIG. 7A shows a schematic diagram of a circuit pattern. This pattern consists of 200 nm×200 nm square vias 702 embedded in an oxide film 701 and composed like a matrix patterns arranged in 5 rows×5 columns at pitches of 800 nm. Each normal via is continued to a wiring 703 in the lower layer. FIG. 7B is an inspection image, that is, a mirror electron image obtained with use of a mirror electron imaging method. The size of the via patterns in this mirror electron image, except for the center one, is as large as 600 nm, which is about 3 times the actual one. This magnification is made due to a distortion of the equipotential surface caused by a difference of voltage between the via voltage and the voltage of its peripheral insulation film. In the mirror electron image shown in FIG. 7B, the center via 704 has a disconnect defect and its voltage differs from that of other normal ones by about +1.5V. The size of the mirror electron image of this defect via 704 is about 1200 nm, which is about double that of a normal via and magnified up to 6 times that of the actual via pattern.

It can thus be concluded from those data that the size of a mirror electron image is magnified to from 3 times to 6 times the actual size due to the via voltage. According to this result, in this embodiment, it is expected to be able to detect defects of patterns up to ⅓ of the pixel size and the horizontal axis of the graph 501 for the inspection speed is displayed for the detection sensitivity, which is ⅓ of the pixel. The value indicated by the horizontal axis of the graph 501 shown in FIG. 5 is converted from the value indicated by the horizontal axis of the graph 501 shown in FIG. 3 on the basis of the above detection sensitivity information. The calculation for converting a value of the horizontal axis or vertical axis such way is executed by a computing device built in the inspection apparatus controller 117 or user interface device with a monitor 118. In the same way, the relationship between the detection sensitivity and the pixel is stored in the memory means built in the inspection apparatus controller 117 or in the user interface device with a monitor 118. As the memory means, for example, any of a memory, a hard disk, etc. may be used.

Next, a description will be made for how to transmit such conditions as user specified inspection speed, etc. to the electron optical system and the wafer stage.

Figure 8:
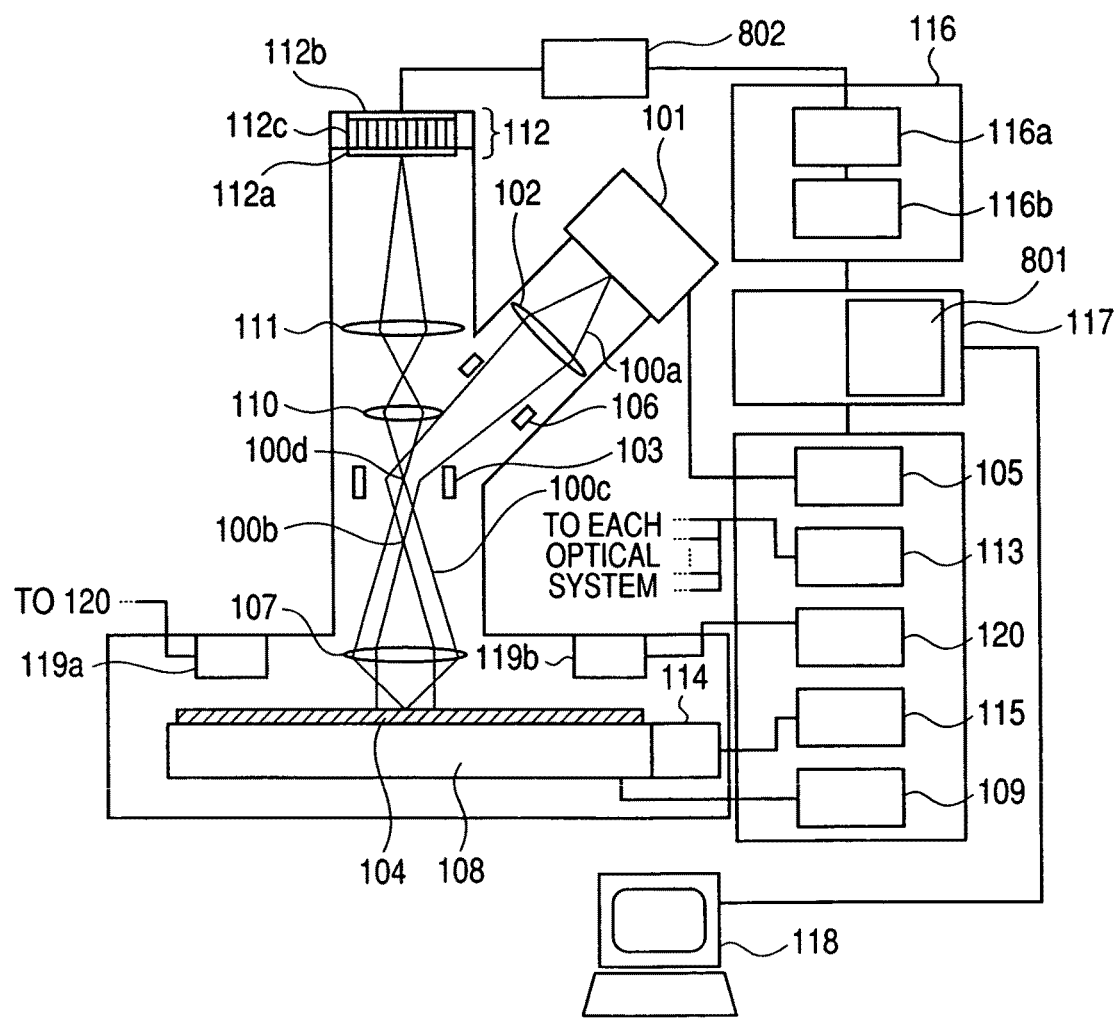
FIG. 8 is a diagram for describing an application example of the present invention to a mirror electron imaging type wafer inspection apparatus.

FIG. 8 shows a schematic diagram of a hardware configuration of a mirror electron imaging type wafer inspection apparatus in this embodiment. In FIG. 8, the same reference numbers will be used for the components of the same functions and operations as those shown in FIG. 1. In the mirror electron imaging type wafer inspection apparatus shown in FIG. 8, the inspection apparatus controller 117 is provided with a conversion part 801. Conditions for inspection operations inputted by the user through the user interface device 118 are sent to the inspection apparatus controller 117. In this embodiment, the inspection apparatus controller 117 is provided with a condition conversion part 801. Conditions inputted through the user interface device with a monitor 118 are values of the pixel size D, inspection speed S, TDI camera image acquisition cycle P, and size of the field of view L. The moving speed Vs of the wafer stage 108 is calculated on the basis of those values. The Vs is determined by the following relational expression according to the TDI camera image acquisition cycle P and the pixel size D.

$$Vs = P \times D$$

This Vs value is sent to the stage controller 115. The stage controller 115 controls a stage driving mechanism by monitoring the stage position information received from the position detector 114 so as to keep the speed Vs while the stage is moving. The TDI camera image acquisition cycle P is sent to the condition conversion part 801 as is. The condition conversion part 801 controls the TDI camera image acquisition cycle so that the image acquisition is synchronized with the stage movement. The pixel size D, as well as a preset pixel size Dp on the TDI camera light detecting surface are used to calculate a magnification Dp/D of the imaging electron optical system. The magnification Dp/D of the imaging electron optical system is sent to the electron optical system controller 113 and used to control the voltage and the electromagnet current applied to the objective lens 107, the intermediate lens 110, and the projection lens 111 respectively. The voltage and current conditions of each electron optical element of the imaging optical system with respect to the magnification of the imaging optical system are stored as a numerical table beforehand in the electron optical system controller 113 or condition conversion part 801. The voltage and current conditions are determined with reference to those values in the table. If a magnification value that is not stored in the table is referred to, current and voltage values are determined by interpolating the values for the nearest magnification value.

The condition conversion part 801 or electron optical system controller 113 stores a numerical table that records conditions of both the condenser lens 102 and the objective lens 107 with respect to the size of the field of view L. And upon a user's determination for the size of the field of view L, the voltage and current values of the illuminating electron optical system are referred to from the numerical table for controlling. With such a configuration, the user selected inspection conditions are reflected correctly in the inspection apparatus.

As described above, therefore, in this embodiment, the user can set such inspection conditions as inspection speed and defect detection sensitivity as parameters. Consequently, the user can operate the apparatus more easily.

Third Embodiment

In the second embodiment, a description is made for a user operation screen on which the defect magnification is set as 3 times. This third embodiment enables the user to change the defect magnification.

Figure 9:
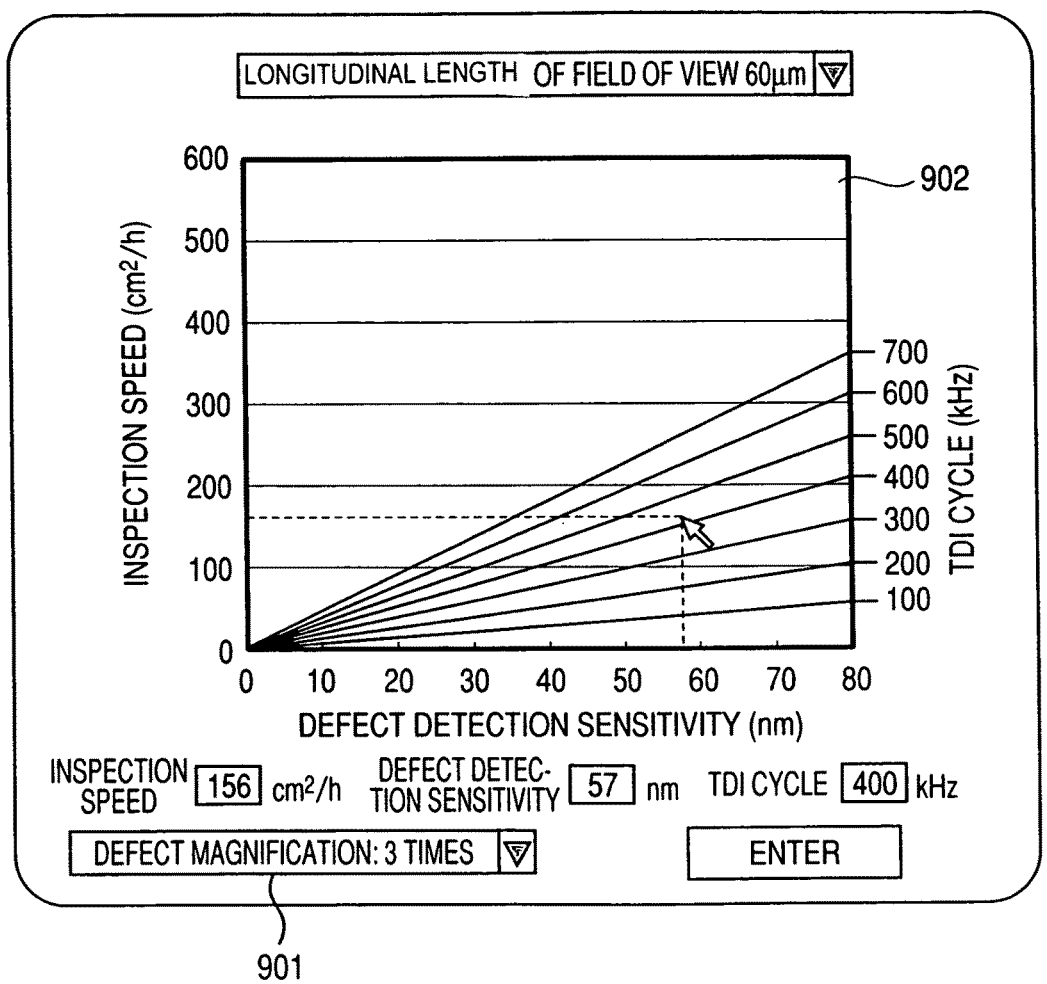
FIG. 9 is a diagram for describing an example of an inspection condition setting screen.

FIG. 9 shows a user operation screen in this third embodiment. The user operation screen shown in FIG. 9 is displayed on the monitor of the mirror electron imaging type wafer inspection apparatus or mirror electron imaging type specimen inspection apparatus. In this third embodiment, the description for the same components as those shown in FIG. 5 will be omitted. In FIG. 9, there is only a difference from that shown in FIG. 5; a defect magnification selection field 901 is provided. The user can select a magnification from a plurality of defect magnification values by clicking the arrow in the defect magnification selection field 901. The value of the horizontal axis of the graph 902 is corrected by the selected defect magnification, thereby the displayed characteristic curve is also corrected.

The user can change the defect magnification according to the objective lens focal condition, the height of the equipotential surface for reflecting mirror electrons, etc. in the mirror electron imaging. A mirror electron image is always formed due to a distortion of the equipotential surface even when the defect type is an uneven surface or a voltage variation caused by an electrical defect. Consequently, the user can estimate a defect image magnification in advance by using the height of the equipotential surface for causing mirror reflection of electrons and focal conditions of the objective lens as parameters.

For such an estimate, the user is just requested to obtain a mirror electron image with respect to a different focal point of the objective lens and a different voltage potential value of the wafer and measure a magnification according to the actual defect size by using an Si wafer of which size is already known and having a protruded or recessed shape defect that is already processed. If the defect type is not such a shape defect, but it is a potential variation, a voltage that causes the equipotential surface to be distorted as much as a distortion generated by a protruded or recessed shape may be calculated by computer simulation and adjusted precisely with the relationship between the electron optical condition and the magnification in the shape defect. Because such calculation of a level of a distortion of an equipotential surface with respect to a voltage is simple calculation of an electrical field, it is so easy. Instead of using a standard specimen as described above, it is also possible to analyze a trajectory of electrons by computer simulation and change the condition of the objective lens, thereby calculating an image to be obtained, then obtaining a relationship with a magnification.

Figure 10:
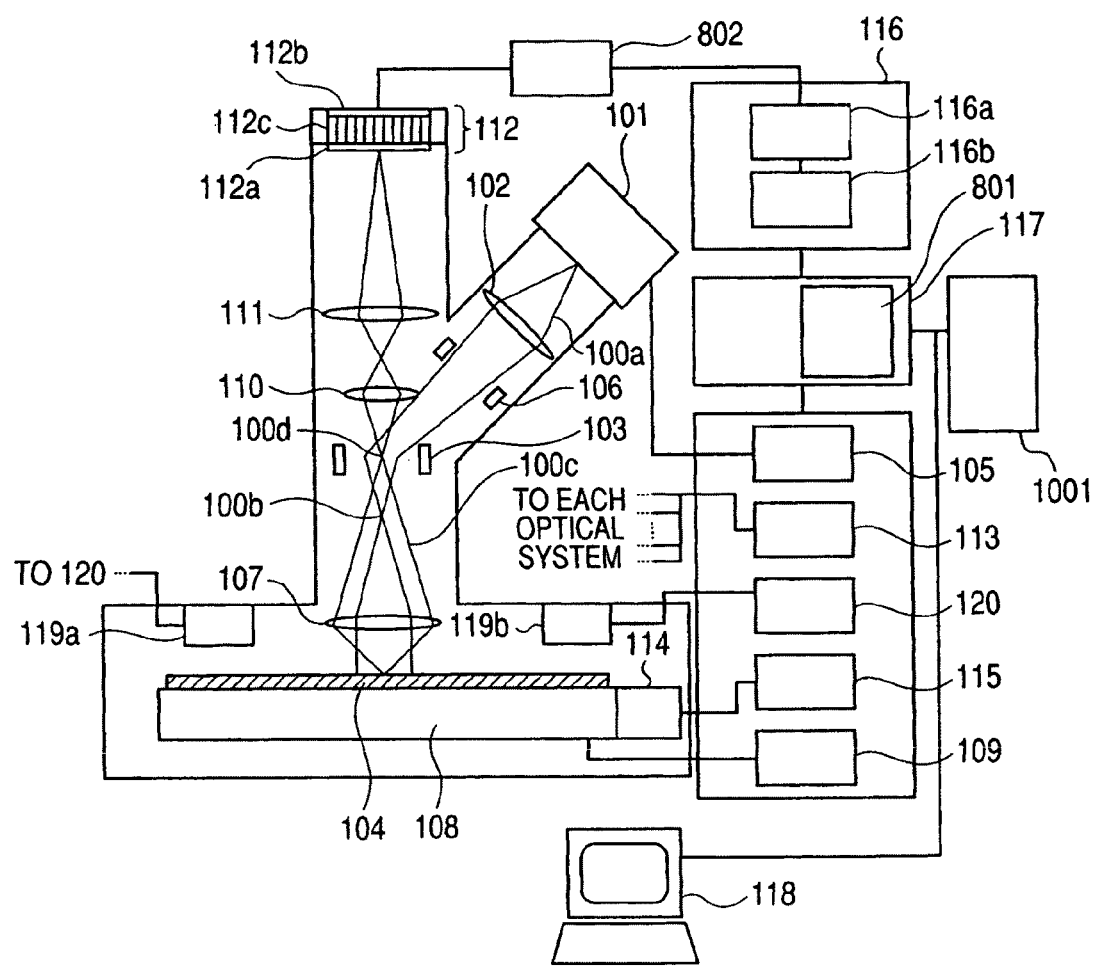
FIG. 10 is a diagram for describing an application example of the present invention to a mirror electron imaging type wafer inspection apparatus.

In this embodiment, the inspection apparatus is provided with an inspection condition evaluation device 1001 for holding a table that stores a condition of the objective lens, a negative voltage value to be applied to each wafer to change its equipotential surface used for mirror reflection, and a defect magnification obtained as described above. FIG. 10 shows a schematic diagram of a system provided newly with the inspection condition evaluation device 1001.

When an inspection is made with a defect magnification using this inspection apparatus, the equipotential surface for reflecting mirror electrons must be kept constant. Thus it is important to keep the wafer surface potential constant. This is why pre-charging devices 119a and 119b are used. Those charging devices are controlled by a pre-charging controller 120. For example, assume now that a wafer is passed under the pre-charging device, then just under the objective lens and moved just under the pre-charging device 119b. In such a case, the wafer surface potential is set to a prescribed potential by the pre-charging device 119a. This potential makes it possible to obtain a desired defect magnification. The potential is given from the numerical table of the inspection condition evaluation device 1001 and controlled by the pre-charging controller 120. As the pre-charging device, for example, such an electron beam illuminating device as a flood gun may be used. After the wafer passes just under the objective lens, the disturbance of the equipotential surface potential, caused by slight charging of the wafer when in observation of mirror electrons, must be eliminated so to as return the potential to a required level with use of the pre-charging device 119b again.

According to this third embodiment, therefore, it is possible to optimize the such conditions as the inspection time including the user specified defect magnification, thereby the object semiconductor manufacturing line can be managed efficiently.

Although a description has been made for the preferred embodiments of the present invention, the present invention also includes a combination of the first to the third embodiment described above.

What is claimed is:

1. An inspection apparatus for inspecting a wafer through imaging, the inspection apparatus comprising:

an electron optical system configured to radiate an electron beam on a certain area of a wafer corresponding to an inspection region of the wafer, the electron optical system including a time delay integration (TDI) sensor, an image processor, a controller, and a wafer stage configured to move the wafer at a set speed, the TDI sensor being configured to detect an image of the wafer upon radiation of the electron beam on the certain area of the wafer and transmit the image as image signals to the image processor, the image processor being configured to receive the image signals, perform an inspection of the inspection region based on the image signals, and output a result of the inspection, the controller being configured to control operations of the electron beam, the TDI sensor, the image processor, and the wafer stage according to a set of conditions; and a display device coupled to the electron optical system and configured to display an indication of the result of the inspection output by the image processor, and wherein the controller is configured to implement a graphical user interface (GUI) that includes a graph element displayed via the display device, the graph element displaying a respective relationship among values of S and D for each of a plurality of values of P on a graph with respect to a specified value of L by assuming D and S as coordinates axes, where each of value of S defines an area of the wafer to be inspected per unit time, each value of D defines a width in a moving direction of the wafer that corresponds to a unit pixel of the image, each value of P defines an image signal acquisition frequency for image signal acquisition cycles, and each value of L defines a length in a direction perpendicular to the moving direction of the wafer for which image data is obtained in each image signal acquisition cycle in a range of an inspection image in the region on which the electron beam is radiated, such that a formula $S=D \times L \times P$ is satisfied for the respective relationships displayed on the graph, wherein the GUI includes a pointer element displayed on the display screen and accessible by a user such that the user can move the pointer within the graph and select a position on the graph, wherein the graph element is implemented to display the values of D and S for each position of the pointer within the graph according to the specified value of L;

wherein the controller is configured to control the electron optical system according to the values of D and S for the position on the graph selected by the user, and wherein the controller is configured to disregard the values for S, L, D, and P that are selected upon the pointer being positioned on the graph when at least one of the values is out of a range in which the apparatus is configured to operate.

2. The apparatus, according to claim 1, wherein the electron beam is a planar electron beam.

3. The apparatus, according to claim 1, wherein the electron optical system is a projection optical system in which the TDI sensor is configured to obtain the image signals to transmit by projecting the inspection region of the image during detection.

4. The apparatus, according to claim 1, wherein the graph element is displayed with a plurality of lines in the graph that each correspond to a respective value of P with respect to a set value of L.

5. The apparatus, according to claim 4, wherein the GUI is implemented to permit the user to specify the value of L, and wherein the graph element is implemented such that the graph is changed corresponding to the value of L specified by the user in accordance with the formula of $S=D \times L \times P$.

6. The apparatus, according to claim 1, wherein the GUI is implemented such that a maximum value of L that can be specified is 200 microns.

7. The apparatus, according to claim 1, wherein the values of D corresponding to positions on the graph are within a range between 0 nm and 250 nm.

8. The apparatus, according to claim 1, wherein the controller holds a numerical table in which a plurality of sets of conditions for operating the electron optical system each corresponding to a respective pair of D and L values are set beforehand and determines a set of conditions for operating the electron lens according to values of D and L specified by the user via the GUI with reference to the numerical table.

9. An inspection apparatus for inspecting a wafer through imaging, the inspection apparatus comprising:

an electron optical system configured to radiate an electron beam on a certain area of a wafer corresponding to an inspection region of the wafer, the electron optical system including a time delay integration (TDI) sensor, an image processor, a controller, and a wafer stage configured to move the wafer at a set speed, the TDI sensor being configured to detect an image of the wafer upon radiation of the electron beam on the certain area of the wafer and transmit the image as image signals to the image processor, the image processor being configured to receive the image signals, perform an inspection of the inspection region based on the image signals, and output a result of the inspection, the controller being configured to control operations of the electron beam, the TDI sensor, the image processor, and the wafer stage according to a set of conditions; and a display device coupled to the electron optical system and configured to display an indication of the result of the inspection output by the image processor, and wherein the controller is configured to implement a graphical user interface (GUI) that includes a graph element displayed via the display device, the graph element displaying a graph related to a time delay integration formula $S=D \times L \times P$ with respect to a plurality of values of P and a specified value of L by assuming D and S as coordinates axes, where each of value of S defines an area of the wafer to be inspected per unit time, each value of D defines a width of the wafer in a direction image in the region on which the electron beam is irradiated in each image acquisition cycle that corresponds to a unit pixel of the image, each value of P defines an image signal acquisition frequency for image signal acquisition cycles, and each value of L defines a length in the direction image in the region on which the electron beam is radiated in each image acquisition cycle, wherein the coordinate axis is S or S' defined as a number of wafers to be processed per hour, an inverse number to define a processing time of one wafer or a time required for a unit area inspection by calculating S, and wherein the GUI includes a pointer element displayed on the display screen and accessible by a user such that a user can move the pointer within the graph and select a position on the graph, wherein the graph element is implemented to display the values of D and S or S' for each position of the pointer within the graph according to the specified value of L;

wherein the controller is configured to control the electron optical system according to the values of D and S or S' for the position on the graph selected by the user, and wherein the controller is configured to disregard the values for S, L, D, and P that are selected upon the pointer being positioned on the graph when at least one of the values is out of a range in which the apparatus is configured to operate.

10. The apparatus, according to claim 9, wherein the electron beam is a planar electron beam.

11. The apparatus, according to claim 9, wherein the electron optical system is a projection optical system in which the TDI sensor is configured to obtain the image signals to transmit by projecting the inspection region of the image during detection.

12. The apparatus, according to claim 9, wherein the graph element is displayed with a plurality of lines in the graph that each correspond to a respective value of P with respect to a set value of L.

13. The apparatus, according to claim 12, wherein the GUI is implemented to permit the user to specify the value of L, and wherein the graph element is implemented such that the graph is changed corresponding to the value of L specified by the user in accordance with the formula of S=D×L×P.

14. The apparatus, according to claim 9, wherein the GUI is implemented such that a maximum value of L that can be specified is 200 microns.

15. The apparatus, according to claim 9, wherein the values of D corresponding to positions on the graph are within a range between 0 nm and 250 nm.

16. The apparatus, according to claim 9, wherein the controller holds a numerical table in which a plurality of sets of conditions for operating the electron optical system each corresponding to a respective pair of D and L values are set beforehand and determines a set of conditions for operating the electron lens according to values of D and L specified by the user via the GUI with reference to the numerical table.

* * * * *